United States Patent [19]

Izuta

[11] Patent Number: 5,410,196
[45] Date of Patent: Apr. 25, 1995

[54] CIRCUIT FOR FINDING THE FREQUENCY BAND OF AN INPUT SIGNAL WHICH MIGHT HAVE DIFFERENT FREQUENCY BANDS

[75] Inventor: Hiroshi Izuta, Itami, Japan

[73] Assignee: Mitsubishi Denki Kabushiki Kaisha, Tokyo, Japan

[21] Appl. No.: 64,429

[22] Filed: May 21, 1993

[30] Foreign Application Priority Data

Jun. 23, 1992 [JP] Japan .................. 4-164827

[51] Int. Cl.⁶ .............................. H03K 9/06
[52] U.S. Cl. ............................. 327/48; 327/49
[58] Field of Search ............ 307/510, 517, 519, 520, 307/524, 516; 328/140, 141, 134

[56] References Cited

U.S. PATENT DOCUMENTS

| 5,180,935 | 1/1993 | Abdi et al. | 307/524 |
| 5,189,378 | 2/1993 | Arai | 328/140 |
| 5,258,720 | 11/1993 | Tanis et al. | 307/516 |

FOREIGN PATENT DOCUMENTS 1211273 8/1989 Japan .

Primary Examiner—William L. Sikes
Assistant Examiner—James A. Dudek
Attorney, Agent, or Firm—Oblon, Spivak, McClelland, Maier & Neustadt

[57] ABSTRACT

An object of the present invention is enhancing a capability of integration of a frequency finding circuit for finding a frequency of an input signal. A signal sampling circuit (21), sampling the input signal, utilizes a sampling signal (G) to convert the input signal into a sampled input signal (S) and inputs it to the frequency finding circuit. A resultant signal (K) from the frequency detecting circuit represents a specific frequency component contained in the input signal and is compared with a specified threshold value by a voltage comparator (25). Although a deciding signal (P) is produced as a result of the comparing, it contains unrequired components other than a sampling period. In order to eliminate the needless components, after sampling the deciding signal (P) in accordance with the sampling signal (G) again, an output circuit (50) latches it. The output circuit (50) includes a latch circuit (26) operating in accordance with the sampling signal G. Since the latch circuit is substitutional for a prior art sample/hold circuit, a capacitor and an external terminal connecting it, both of which are required by the sample/hold circuit, are no longer needless.

15 Claims, 9 Drawing Sheets

CIRCUIT FOR FINDING THE FREQUENCY BAND OF AN INPUT SIGNAL WHICH MIGHT HAVE DIFFERENT FREQUENCY BANDS

BACKGROUND OF THE INVENTION

1. Field of the Invention

The present invention relates to a frequency finding circuit for finding a frequency band of an input signal, and more particularly, it relates to an apparatus for processing input signals having different frequency bands.

2. Description of the Prior Art

FIG. 9 shows an architecture of a prior art frequency finding circuit 103. An input signal of which frequency is to be found is input to an input terminal 11. For reasons, for example, that a frequency of the input signal must be found for a period when the frequency is relatively stable, a signal sampling circuit 21 obtains values of the input signal for a specified period (sampling period) in accordance with a sampling signal G input on a terminal 13; that is, it performs-sampling. A sampled input signal S is converted by a frequency discriminator 30 into a d.c. signal K having a value corresponding to the frequency of the input signal only for the sampling period. The signal K transmitted through a sample/hold circuit 24 is compared with a specified reference voltage by a voltage comparator 25. A result of the comparison is applied as a deciding signal to an output terminal 12.

The frequency discriminator 30 is comprised, for example, of a resonance circuit 34, a phase shifter 23 for shifting a phase of the input signal by a difference between a resonance frequency of the resonance circuit 34 and a frequency of the sampled input signal S, and a phase detector 22 for receiving the resultant phase from the phase shifter 23.

The prior art frequency finding circuit is configured and performs the sampling of an input signal in such a manner as mentioned above, and therefore, an output from the frequency discriminator 30, namely, the signal K, is significant only for the sampling period. Thus, applying the signal K in raw data to the comparator 25 cannot allow the deciding signal applied to the output terminal 12 to represent the frequency of the input signal. This is why the sample/hold circuit 24 must sample the output from the frequency discriminator 30 in accordance with the sampling signal G to obtain values contained by the signal K, and thereafter apply to the voltage comparator 25.

In this stage, in order to gain a stable result, it is desirable for the sample/hold circuit 24 to have a larger time constant. For that purpose, the sample/hold circuit 24 must have a capacitor 34 connected through an external terminal 42. However, integration of the capacitor 34 is difficult, and an existence of the external terminal 42 may prevent an enhancement of a capability of the integration; that is, the prior art frequency finding circuit has the problem that its integration is difficult.

SUMMARY OF THE INVENTION

According to the present invention, a frequency finding circuit comprises an input terminal, an output terminal, a signal sampling circuit receiving a control signal for sampling for an specified period of time an input signal received on the input terminal in accordance with the control signal to output a sampling signal, a frequency deciding circuit for producing a deciding signal which represents whether a frequency of the sampling signal is in a specified frequency band, and an output circuit receiving the deciding signal for applying an output signal to the output terminal, the output circuit having a latch circuit which holds the deciding signal in accordance with the control signal.

Preferably, the latch circuit is a flip flop.

Preferably, the frequency deciding circuit includes a discriminator for discriminating an amplitude signal from the sampling signal.

Preferably, the discriminator includes a resonance circuit, a phase shifter for outputting a converted signal which is obtained by shifting a phase of the sampling signal based upon a difference between a resonance frequency of the resonance circuit and a frequency of the sampling circuit, and a phase detector for outputting a phase difference between the converted signal and the sampling signal.

Preferably, the frequency deciding circuit further includes a signal comparator for converting an output from the phase detector into a binary signal at a specified threshold level, and the binary signal is equivalent to the deciding signal.

Preferably, the discriminator includes a band limiter for filtering the sampling signal, and an amplitude detecting circuit for detecting an output from the band limiting circuit to output the amplitude signal.

Preferably, the frequency deciding circuit further includes a signal comparator for converting an output from the amplitude detecting circuit into a binary signal at a specified threshold level, and the binary signal is equivalent to the deciding signal.

Preferably, the output circuit further has a logic circuit for conducting a specified procedure to the deciding signal in accordance with the control signal to obtain the output signal.

Preferably, the sampling signals are of plural including a first sampling signal and second sampling signals which are preceded by the first sampling signal, the logic circuit inverts a first of the output signal obtained based upon the first sampling signal when the number of the deciding signals derived from the second sampling signals different in logic from the first of the output signal is equal to a specified upper limit level or over.

Preferably, the logic circuit includes a counter for counting the incessantness of discordances of a logic of the deciding signal with a logic of the output signal, and an incessantness comparator for comparing the incessantness of discordances with the upper limit level.

Preferably, the logic circuit further includes an input deciding unit for finding a discordance of a logic of the deciding signal with a logic of the output signal, a gate circuit for resetting the counter when an output from the input deciding unit exhibits a concordance of a logic of the deciding signal with a logic of the output signal and when the control signal is activated, fixed variable storing means for applying the upper limit level to the comparator, and an inverter for inverting the output signal when an output from the counter represents that the incessantness of the discordances is equal to the upper limit level or over.

Preferably, the input deciding unit includes a switch for switching a connecting condition in accordance with a logic status of the output signal having a common terminal connected to the counter, a first terminal on which the deciding signal is input, a second terminal to which a logic inverted from the deciding signal is applied.

Preferably, the logic circuit includes an n-level shift register operating in accordance with the control signal, a counter for counting the incessantness of discordances of a logic of each level of the shift register with a logic of the output signal, and an incessantness comparator for comparing the incessantness of the discordances with the upper limit level.

Preferably, the logic circuit further includes an input deciding unit for finding a discordance of a logic of the deciding signal with a logic of the output signal to apply it to the shift register, a clock generator controlling an operation of the counter for generating a clock having a frequency more than the n-times as high as a frequency of the control signal, a selector for applying a logic of each level of the shift register to the counter in accordance with the clock, fixed variable storing means for applying the upper limit level to the comparator, and an inverter for inverting the output signal when an output from the counter represents that the incessantness of the discordances is equal to the upper limit level or over, and the shift register is reset when the inverter is operative.

Preferably, the input deciding unit includes a switch for switching a connecting condition in accordance with a logic status of the output signal having a common terminal connected to the counter, a first terminal on which the deciding signal is input, a second terminal to which a logic inverted from the deciding signal is applied.

Since a latch circuit in a first aspect of the present invention holds a deciding signal in accordance with a control signal, only that which corresponds to a sampling signal in the deciding signal is applied as an output signal to an output terminal. The latch circuit holds the deciding signal without an external terminal and a capacitor.

Furthermore, in a logic circuit in a second aspect of the present invention, stability of a result of the deciding signal is enhanced. Specifically, if an event which causes the deciding signal to be different in logic from the output signal arises, the logic circuit never validate this unless the event arises as many times as a specified upper limit level or over. A counter and a shift register count the incessantness of such events.

According to a frequency finding circuit in a first aspect of the present invention, a latch circuit holds a deciding signal without an external terminal and a capacitor, and therefore, a capability of integration of the frequency finding circuit can be enhanced.

Furthermore, according to a frequency finding circuit in a second aspect of the present invention, even if an event which causes a deciding signal and an output signal to be different in logic occurs, a logic circuit never validate it unless the event occurs as many times as a specified upper limit value or over, and therefore, stability of the detecting can be enhanced.

Accordingly, it is an object of the present invention to provide a frequency finding circuit which is integrated without using an external terminal and a capacitor connected thereto so as to find a frequency in a stable condition.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

A. Embodiment 1

Figure 1:
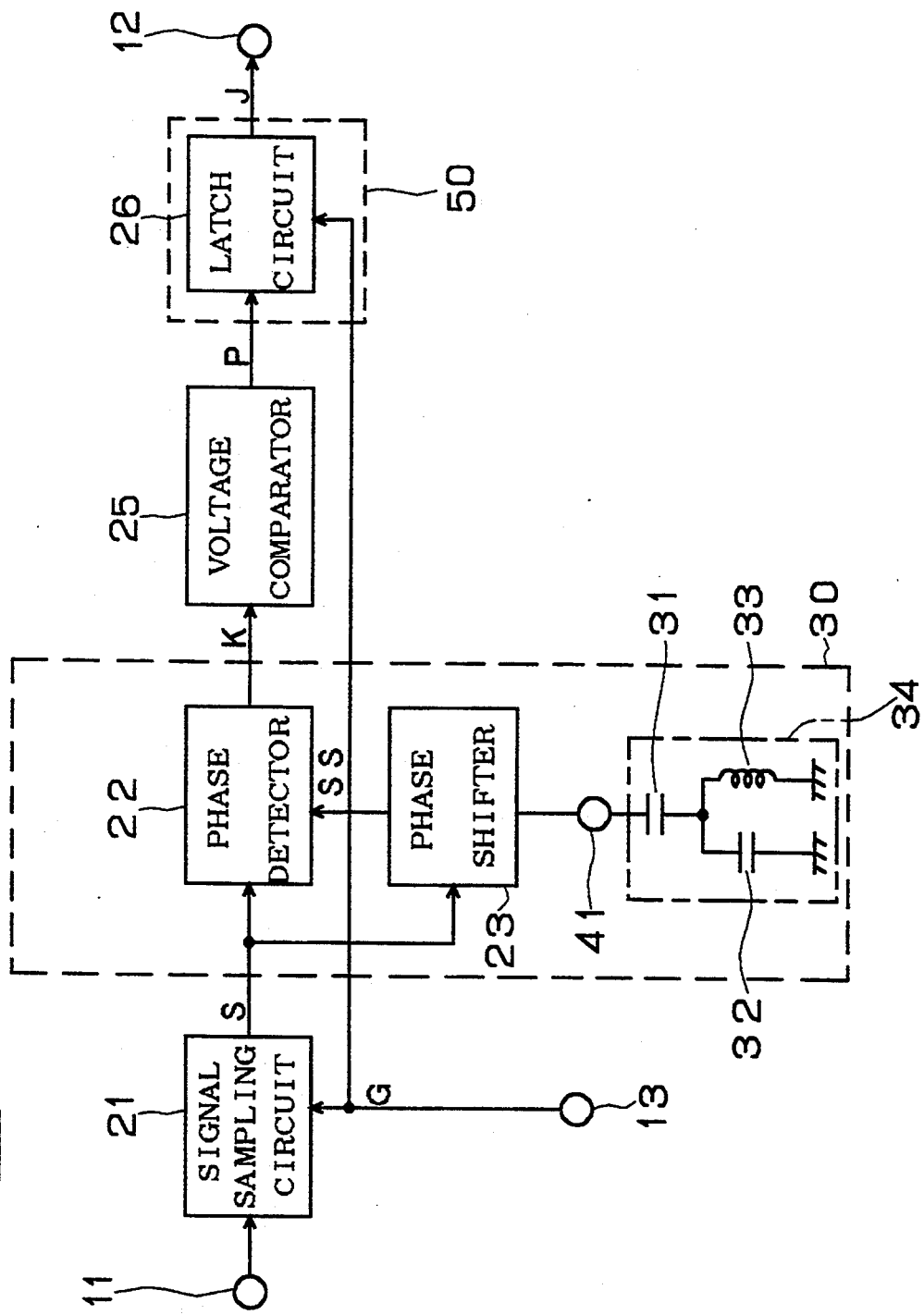
FIG. 1 is a block diagram illustrating a structure of a first preferred embodiment according to the present invention.

FIG. 1 is a block diagram showing a structure of a frequency finding circuit 100 of a first preferred embodiment according to the present invention. Between its input terminals 11 and 12, a signal sampling circuit 21, a frequency discriminator 30, a voltage comparator 25, and an output circuit 50 are connected in series in this order.

The signal sampling circuit 21 receives on the input terminal 11 an input signal of which frequency is to be found, and it obtains values of the input signal for a specific period of time (sampling time) in accordance with a sampling signal G input through a terminal 13; that is, it performs sampling. The sampling is for limiting a time to find a frequency band to a time for which a frequency can be relatively specified in case input is FM modulated or the frequency is varied every moment. For example, in finding a frequency band of a signal wave obtained by FM modulating a video signal, finding of the frequency can be stably performed by employing a period of a synchronizing signal of the video signal as a sampling timing.

The frequency discriminator 30 consists of a resonance circuit 34, a phase shifter 23, and a phase detector 22, and the phase shifter 23 and the resonance circuit 34 are connected to each other with a terminal 41 intervening between them. A sampled input signal S is applied to the phase shifter 23 and the phase detector 22, respectively.

The phase shifter 23 compares a frequency of the sampled input signal S with a resonance frequency of the resonance circuit 34, shifts a phase of the sampled input signal S in accordance with a comparison result, the difference therebetween, and then supplies a signal SS to the phase detector 22.

Figure 2:
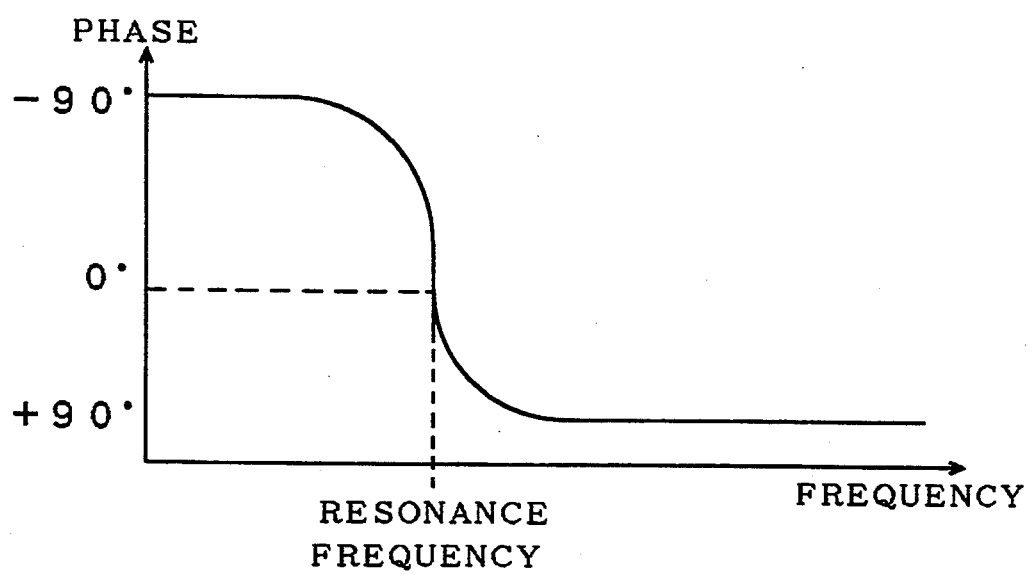
FIG. 2 is a graph illustrating an operation of the first preferred embodiment according to the present invention.

FIG. 2 is a graph representing an operation of the phase shifter 23. The horizontal axis concerns a frequency of the sampled input signal S while the vertical axis concerns a phase deviation the signal SS out of the sampled input signal S. The phase of the sampled input signal S is put back to produce the signal SS if the frequency of the sampled input signal S is lower than the resonance frequency of the resonance circuit 34, or the phase of the sampled input signal S is put forward to produce the signal SS if the frequency of the sampled input signal S is higher than the resonance frequency of the resonance circuit 34. A variation in the phase is the greater close to the resonance frequency. The resonance frequency is determined according to element coefficients of capacitors 31 and 32 and an inductor 33 which together constitute the resonance circuit 34.

The phase detector 22 detects the phases of the signals S and SS, and detection results are converted into d.c. voltage or the like to produce a signal K. As mentioned above, the phase of the signal SS varies due to the difference between the resonance frequency of the resonance circuit 34 and the frequency of the signal S. Thus, for the sampling period, output from the phase detector 22, namely, the signal K output from the frequency discriminator 30 is a d.c. signal representing how much the frequency of the sampled input signal S is higher than the resonance frequency of the resonance circuit 34 or how much it is lower. In other words, the frequency discriminator 30 discriminates among variations in the sampled input signal S.

The voltage comparator 25 compares the signal K with a specified reference voltage regardless of the sampling period to produce a binary logic deciding signal P. For the sampling period, the deciding signal P decides whether the frequency of the sampled input signal S is higher or lower than the desired frequency, namely, the resonance frequency of the resonance circuit 34. However, any time except for the sampling period, the deciding signal P has no information about input signals.

For the reason, the output circuit 50 converts the deciding signal P into an output signal J to apply to an output terminal 12 significant part alone of the deciding signal P, that is, part carrying information about the frequency of the sampled input signal S.

The output circuit 50 works in accordance with the sampling signal G to produce the significant part alone of the deciding signal P, that is, a logic represented by the deciding signal P for the sampling period, as the output signal J. In this preferred embodiment, the output circuit 50 is comprised of only a latch circuit 26.

The latch circuit 26 latches the deciding signal P in accordance with the sampling signal G, and therefore, the logic presented by the deciding signal P any time except for the sampling period is eliminated. Specifically, part having information about matters other than the sampled input signal S cannot pass the latch circuit 26. In other words, as to two successive sampling periods, the matter (the deciding signal P) held by the latch circuit for the preceding sampling period is not updated until the latch circuit 26 is operative for the succeeding sampling period.

Thus, functions effected by a sample/hold circuit 24 in a conventional frequency finding circuit 103 are performed substitutively by the latch circuit 26. Then, since the latch circuit 26, for example, can consist of a flip flop, it requires no capacitor 34 to effect those functions and accordingly no external terminal 42.

B. Embodiment 2

The art corresponding to the improvement in the prior art technology that a capacity value of the capacitor 34 is raised to obtain a stable operation of the sample/hold circuit 24 can be employed in the present invention.

Figure 3:
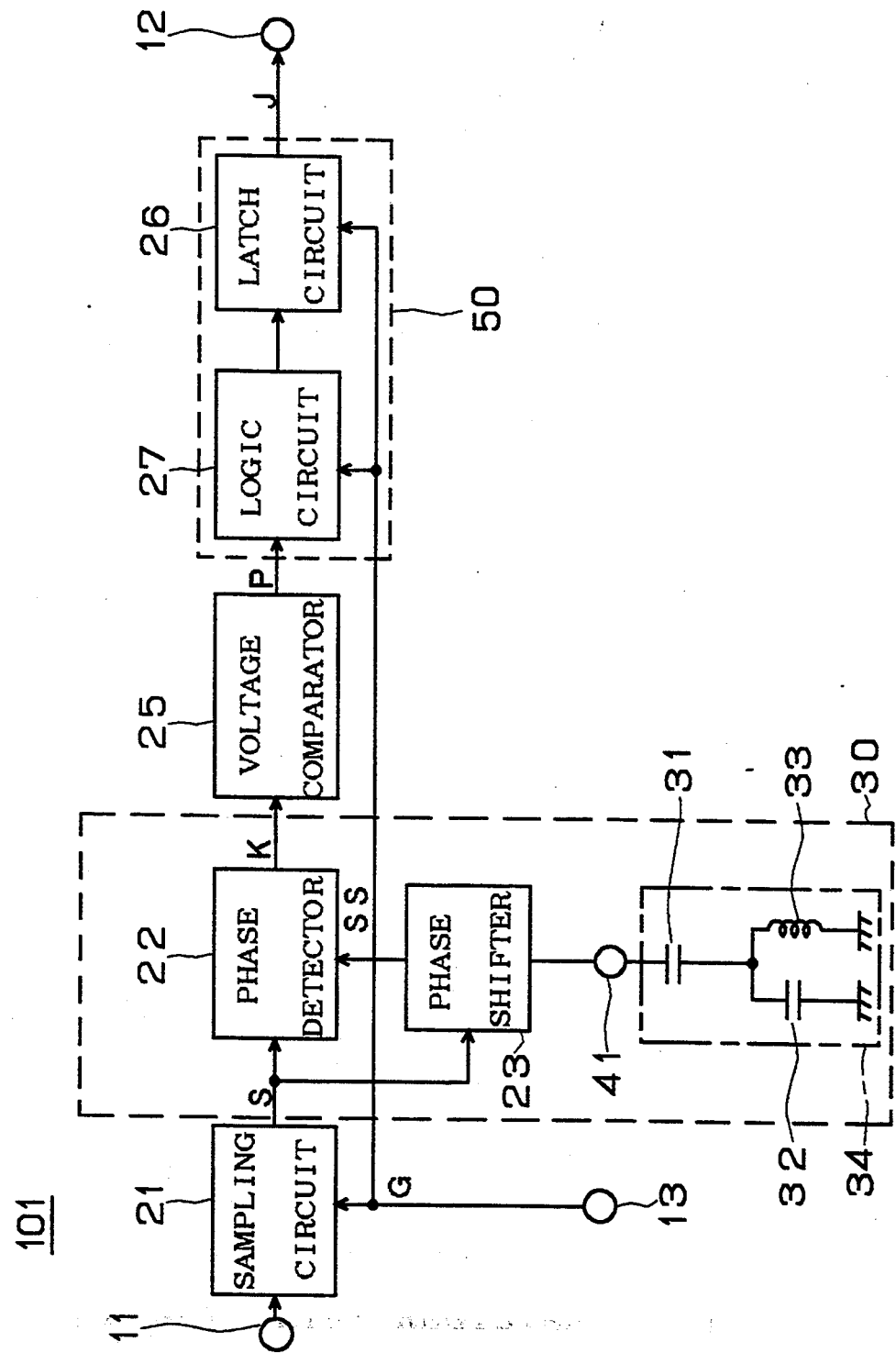
FIG. 3 is a block diagram illustrating a first exemplary structure of a second preferred embodiment according to the present invention.

FIG. 3 is a block diagram showing a structure of a frequency finding circuit 101 of a second preferred embodiment according to the present invention. This differs from the first preferred embodiment in only that an output circuit 50 includes not only a latch circuit 26 but also a logic circuit 27 in its previous stage.

Similar to the latch circuit 26, the logic circuit 27 operates in accordance with a sampling signal G. It is examined whether a result of the deciding signal P is sufficiently reliable, and if so, the result of the deciding signal P is delivered to the latch circuit 26 to latch it. Specifically, when a logic different from a result of the output signal J already obtained as a result of a previous sampling is delivered to a logic circuit 27 by the deciding signal P obtained as a result of a succeeding sampling, it is judged if the logic of the output signal J should be inverted. The logic of the output signal J is inverted if the result of the judging is highly reliable while the logic of the output signal J is not inverted if not.

In order to identify an extent of the reliability, information which are derived from the deciding signal P every time the sampling signal G is activated are counted, and it is examined whether the information having a logic different from that of the output signal J can be obtained as many times as a specified upper limit level or above. Particulars about an enhancement of stability of the output signal J because of provision of such a logic circuit 27 will be described in the context of an exemplary structure.

(B-1) Exemplary Structure 1

Figure 4:
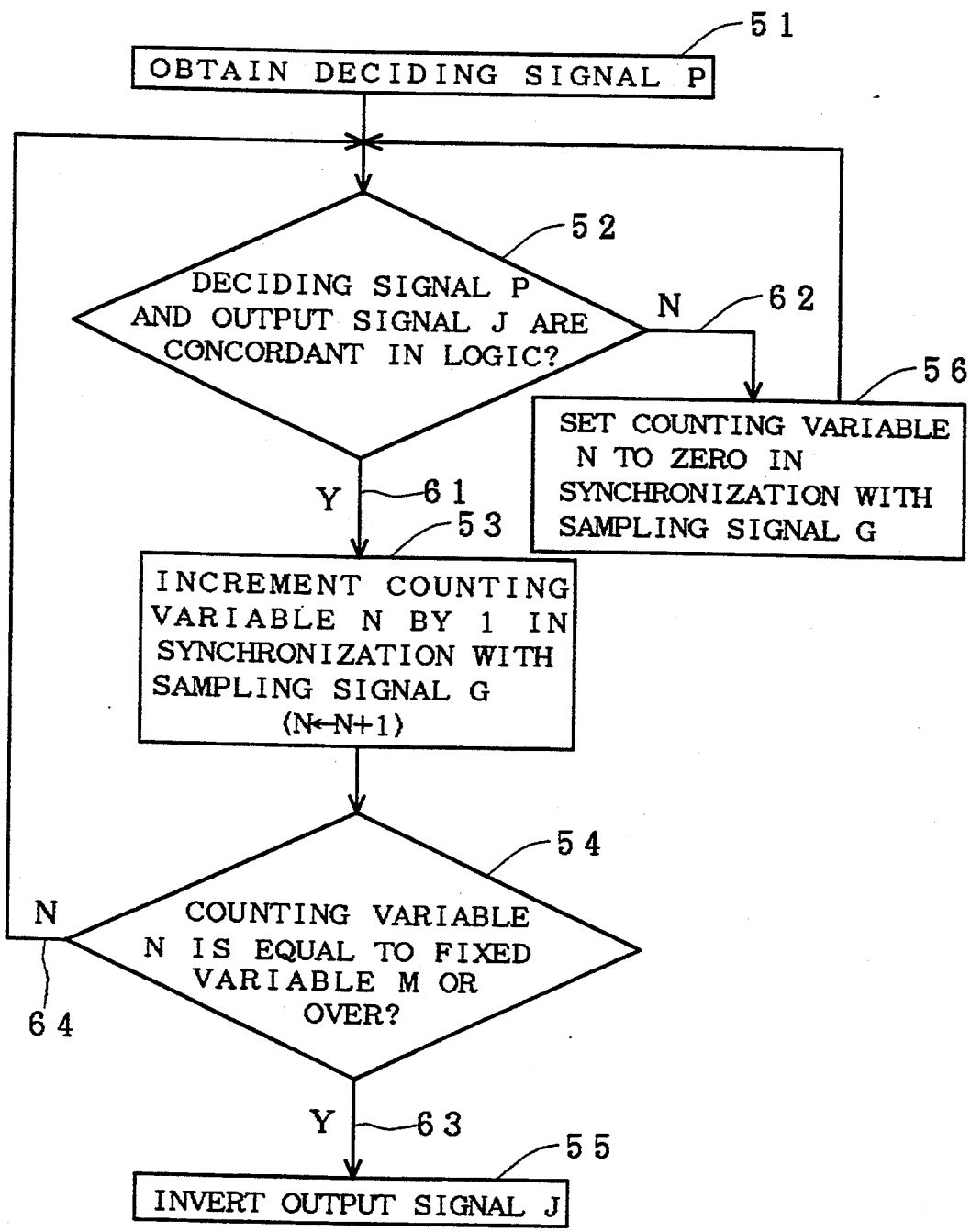
FIG. 4 is a flow chart illustrating an operation of the first exemplary structure of the second preferred embodiment according to the present invention.

FIG. 4 is a flow chart illustrating an operation of the logic circuit 27. First at Step 51 the deciding signal P is received from the voltage comparator 25. This Step 51 is always executed regardless of whether the sampling signal G is activated, and the deciding signal P is applied to the logic circuit 27.

Next at Step 52, it is examined whether the deciding signal P and the output signal J are concordant/discordant in logic with each other. As described, at this step the deciding signal P contains undesired components other than information about a frequency of the input signal.

Since there is no need of conducting an inversion of a logic of the output signal J if the deciding signal P and the output signal J are concordant in logic at Step 52, a flow 62 leads the program to Step 56, and a counting variable N is set to naught in synchronization with the sampling signal G. The program returns to Step 52, and the Step 52 is executed on the newly obtained deciding signal P again.

On the contrary, since there is possibility to conduct an inversion of the logic of the output signal J if the deciding signal P and the output signal J are discordant in logic with each other at Step 52, a flow 61 leads the program to Step 53, and the counting variable N is incremented by 1 in synchronization with the sampling signal G.

If an execution of Step 53 results in the deciding signal P and the output signal J being continually discordant in logic with each other, the counting variable N is incremented in its value. Then, the value of the counting variable N is compared with a fixed variable M presenting an upper limit (Step 54). When the counting variable N is less than the fixed variable M, a flow 64 leads the program to Step 52, but when it equals the fixed variable M or over, a flow 63 leads the program to Step 55.

In this case, it is decided at Step 54 that the deciding signal P and the output signal J are surely discordant in logic with each other, so the logic of the output signal J is inverted at Step 55. The inverted output signal J is applied to the latch circuit 26, and the latch circuit 26 holds the output signal J in synchronization with the sampling signal G (FIG. 3).

Putting the logic circuit 27 operating in the above mentioned manner in the previous stage of the latch circuit 26, the resultant information received from an output terminal 12 becomes stable. For example, if a frequency band of the input signal after its transitional stage causes a transition at about the resonance frequency of the resonance circuit 34, chattering is caused in the deciding signal P in the transition stage. According to this exemplary structure, however, the output signal J is inverted only when the deciding signal P and the output signal J are discordant in logic with each other continually as many times as M or over. Thus, the chattering caused in the deciding signal P is removed from the output signal J, and a transition of a frequency of the input signal can be detected in a stable condition.

Figure 5:
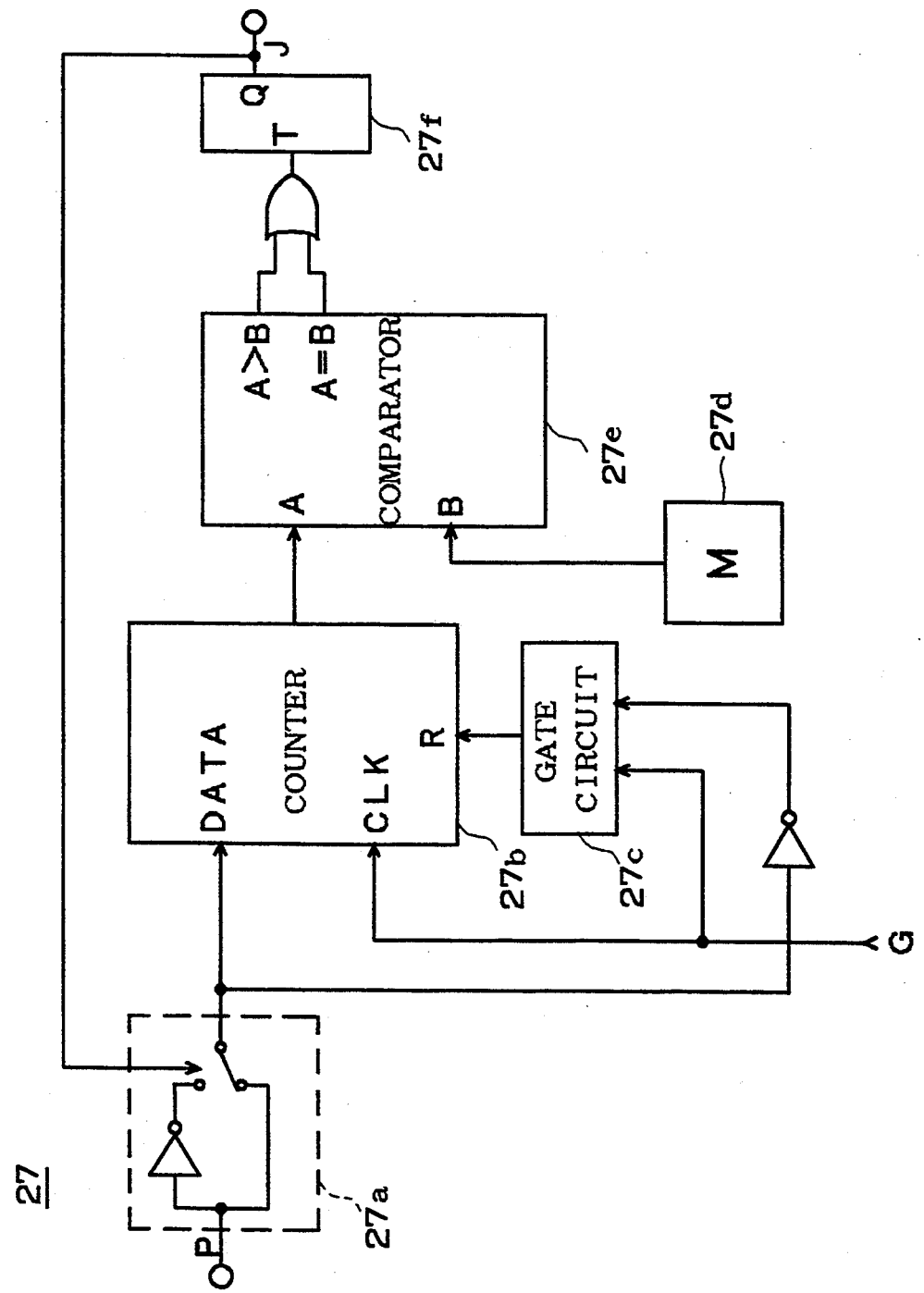
FIG. 5 is a block diagram illustrating an architecture of a logic circuit used in the first exemplary structure of the second preferred embodiment according to the present invention.

FIG. 5 is a block diagram showing a structure of the logic circuit 27 which performs the operation represented by the flow chart in FIG. 4. The deciding signal P is first input to an input deciding unit 27a. The input deciding unit 27a includes a switch which moves to its upper position if output from an output inverter 27f or the output signal J is High and moves to its lower position if the output J is Low. Consequently, a signal of which logic is inverted from that of the deciding signal P is applied to a counting input terminal of a counter 27b if the output signal J is High while the deciding signal P is applied thereto if the output signal J is Low. In other words, Low is applied to the counting input terminal of the counter 27b if the deciding signal P and the output signal J are discordant in logic with each other while High is applied thereto if they are discordant, and the operation of the input deciding unit 27a corresponds to Step 52 shown in FIG. 4.

The counter 27b operates with the sampling signal G acting as a clock. It counts the number of "High"s applied to the counting input terminal of the counter 27b, and its operation corresponds to Step 53 shown in FIG. 4.

On the other hand, the counter 27b is reset by a gate circuit 27c. Since the resetting is performed in accordance with the sampling signal G when output from the input deciding unit 27a is Low, the operation of the gate circuit 27c corresponds to Step 56 shown in FIG. 4.

Results of the counting by the counter 27b are applied to an input terminal A of a comparator 27e. A fixed variable storing circuit 27d which stores the fixed variable M representing the upper limit is connected to an input terminal B of the comparator 27e. When either i) A=B or ii) A>B in outputs from the comparator 27e is activated, the output inverter 27f consisting of a T-flip flop is inverted. Thus, the comparator 27e detects that the output signal J and the deciding signal P are discordant in logic with each other M times or over at a timing applied by the sampling signal G, and its operation corresponds to Step 54 shown in FIG. 4. The output inverter 27f corresponds to Step 55 shown in FIG. 4.

In view of the foregoing, it will be found the logic circuit 27 having the structure illustrated in FIG. 5 embodies the frequency finding circuit 101 shown in FIG. 3 and attains the second preferred embodiment according to the present invention.

(B-2) Exemplary Structure 2

Figure 6:
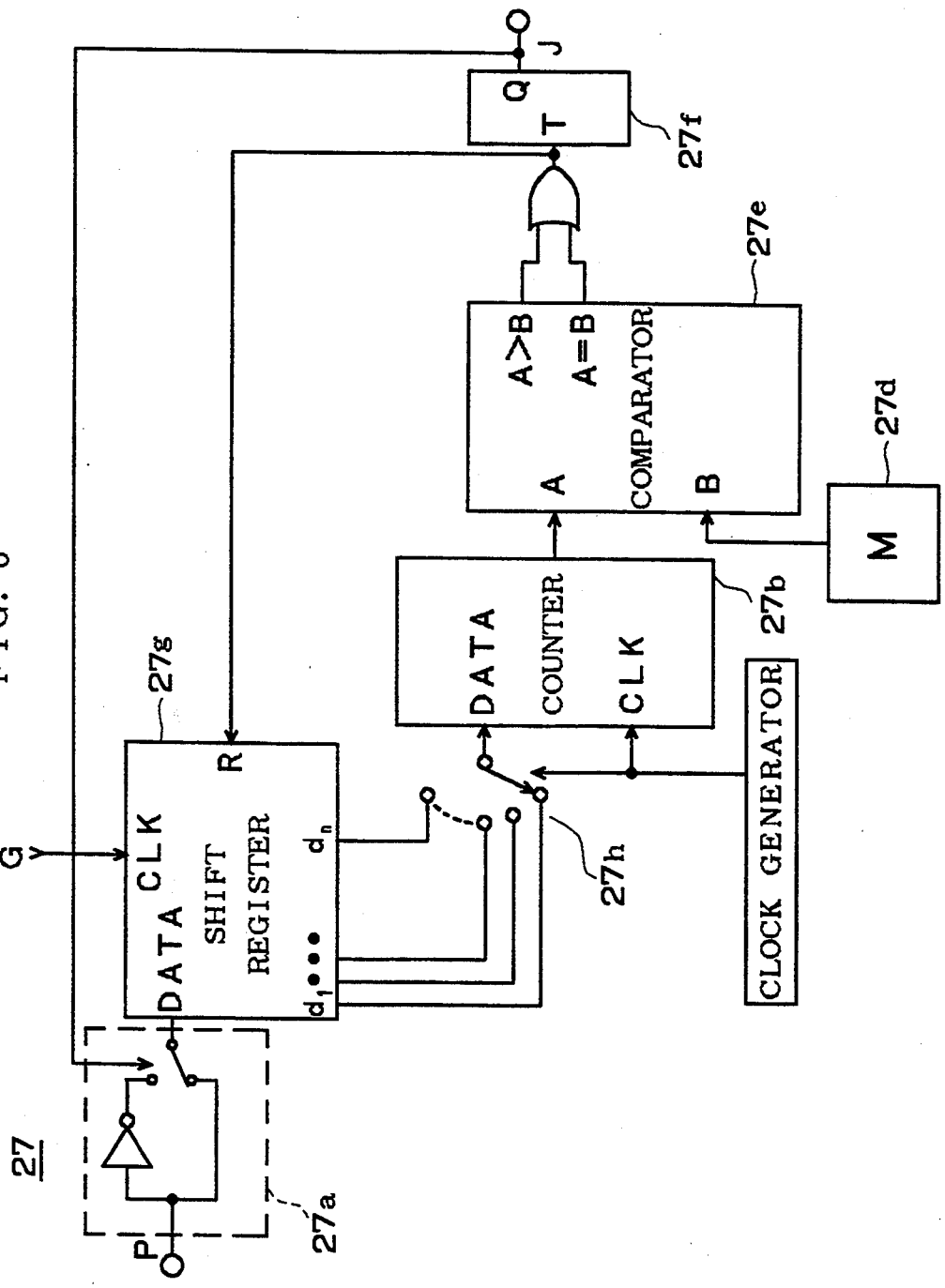
FIG. 6 is a block diagram illustrating an architecture of a logic circuit used in the second preferred embodiment according to the present invention.

FIG. 6 is a block diagram illustrating another structure of the logic circuit 27. Similar to the first exemplary structure, the input deciding unit 27a receives the deciding signal P, and it outputs Low if the deciding signal P and the output signal J are concordant in logic with each other or outputs High if they are discordant.

An input of an n-level shift register 27g is connected to the input deciding unit 27a, and concordance or discordance in logic of the deciding signal p and the output signal J is successively transmitted to the shift register 27g in accordance with the sampling signal G.

A logic status in each level of the shift register 27g is successively applied to the counter 27b by a switching circuit 27h. The switching circuit 27h switches in accordance with a clock from a clock generator having a frequency n or more times as high as a frequency of the sampling signal G. Hence, the contents of the shift register 27g which are held for a period from a certain sampling time to the following sampling time can be delivered to the counter 27b.

The counter 27b also operates with the same clock as a clock according to which the switching circuit 27h switches, and therefore, "High"s existing in the contents of the shift register 27g can be counted.

A result of the counting is compared with the fixed variable M ($<$n) stored in the fixed variable storing circuit 27d by the comparator 27e, similar to the first exemplary structure. If there are M or more "High"s in the contents of the shift register 27g, the output signal J is inverted by the output inverter 27f.

As will be recognized from the structure mentioned above, putting the logic circuit 27 with the structure shown in FIG. 6 in the previous stage of the latch circuit 26, information from the output terminal 12 becomes stable, similar to the first exemplary structure. In this second exemplary structure, however, concordance/discordance of the deciding signal P and the output signal J during n successive sampling periods is monitored at a time. Thus, when they are discordant with each other M times out of n times even though not continually discordant, it is confirmed that the deciding signal P and the output signal J are discordant in logic with each other, and the output signal J can be adapted to be inverted.

Outputs from the input deciding unit 27a are successively transmitted to the shift register 27g, and therefore, the shift register 27g must be reset once the output signal J is to be inverted. Hence, an input terminal T of the output inverter 27f and a reset terminal R of the shift register 27g are commonly connected.

It will be recognized from the foregoing that the logic circuit 27 with the structure illustrated in FIG. 6 embodies the frequency finding circuit 101 illustrated in FIG. 3 and that it implements the second preferred embodiment according to the present invention as in the first exemplary structure, and thus, similar effects can be attained.

Figure 7:
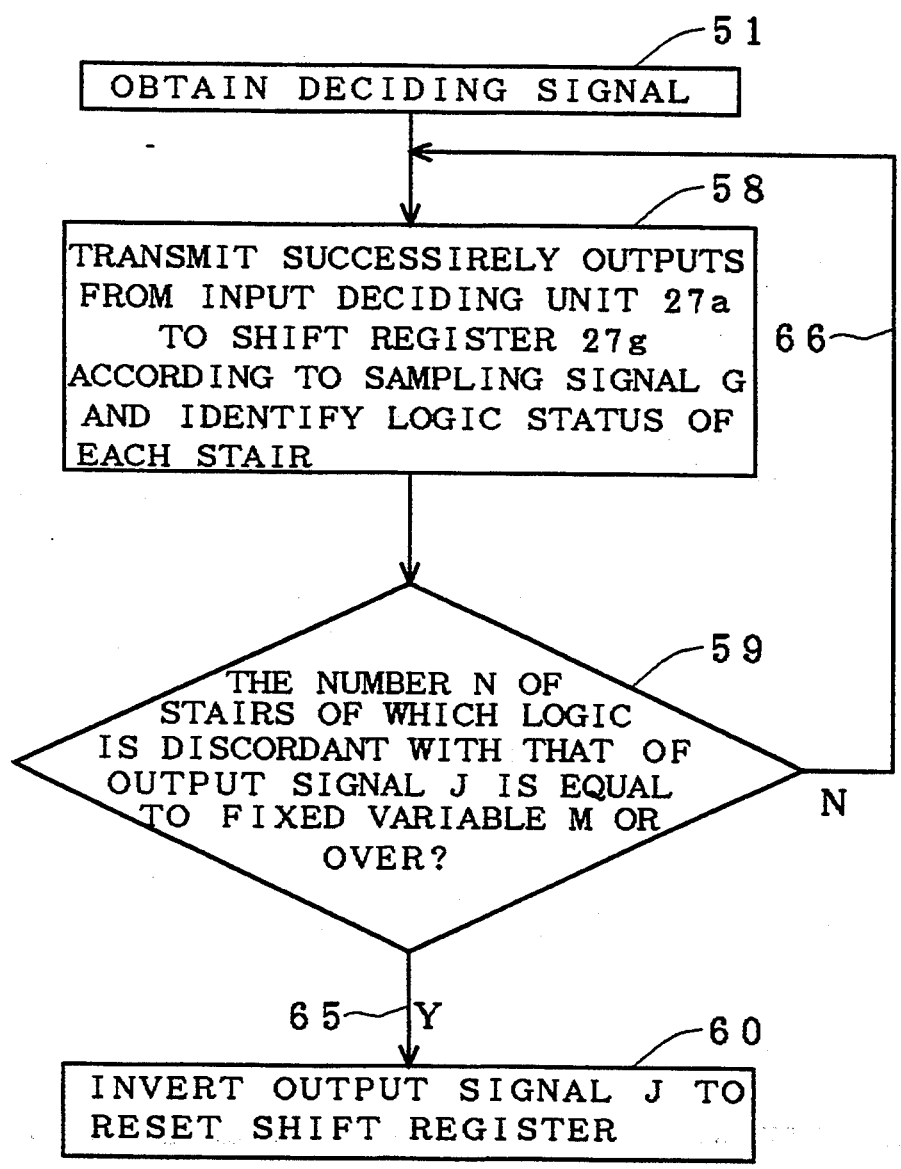
FIG. 7 is a flow chart illustrating an operation of the second exemplary structure of the second preferred embodiment according to the present invention.

FIG. 7 is a flow chart showing the operation of the logic circuit 27 illustrated in FIG. 6. Step 51 is always executed regardless of whether the sampling signal G is activated, and the deciding signal P is applied to the logic circuit 27 similar to the case of the first exemplary structure.

At Step 58, outputs from the input deciding unit 27a representing concordance/discordance in logic of the deciding signal P with the output signal J are successively transmitted to the shift register 27g. A timing of the transmitting is in accordance with the sampling signal G. Then, the switch circuit 27h and the counter 27b are utilized to count those which have a logic discordant with a logic of the output signal J in n-level registers contained by the shift register 27g.

A result of the counting is compared with the fixed variable M by the comparator 27e at Step 59, and if it is judged that the number of discordants is insufficient, a flow 66 leads the program back to Step 58.

Since it is sure that the deciding signal P and the output signal J are discordant in logic, a logic of the output signal J is inverted at Step 60. On the other hand, the shift register 27g is reset. The output signal J is applied to the latch circuit 26, and the latch circuit 26 holds the output signal J in synchronization with the sampling signal G (FIG. 3).

C. Embodiment 3

Figure 8:
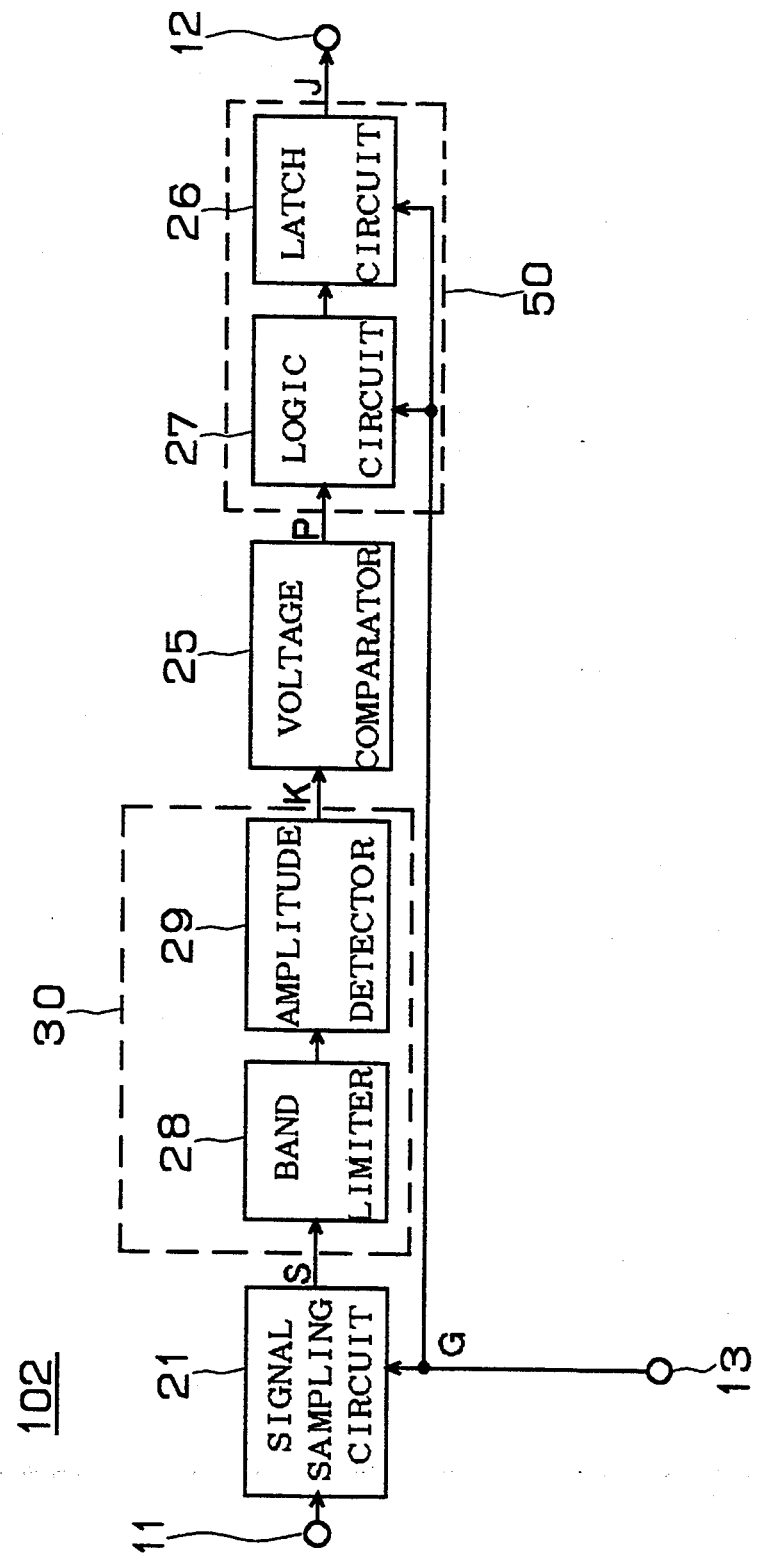
FIG. 8 is a block diagram illustrating a structure of a third preferred embodiment according to the present invention.
Figure 9:
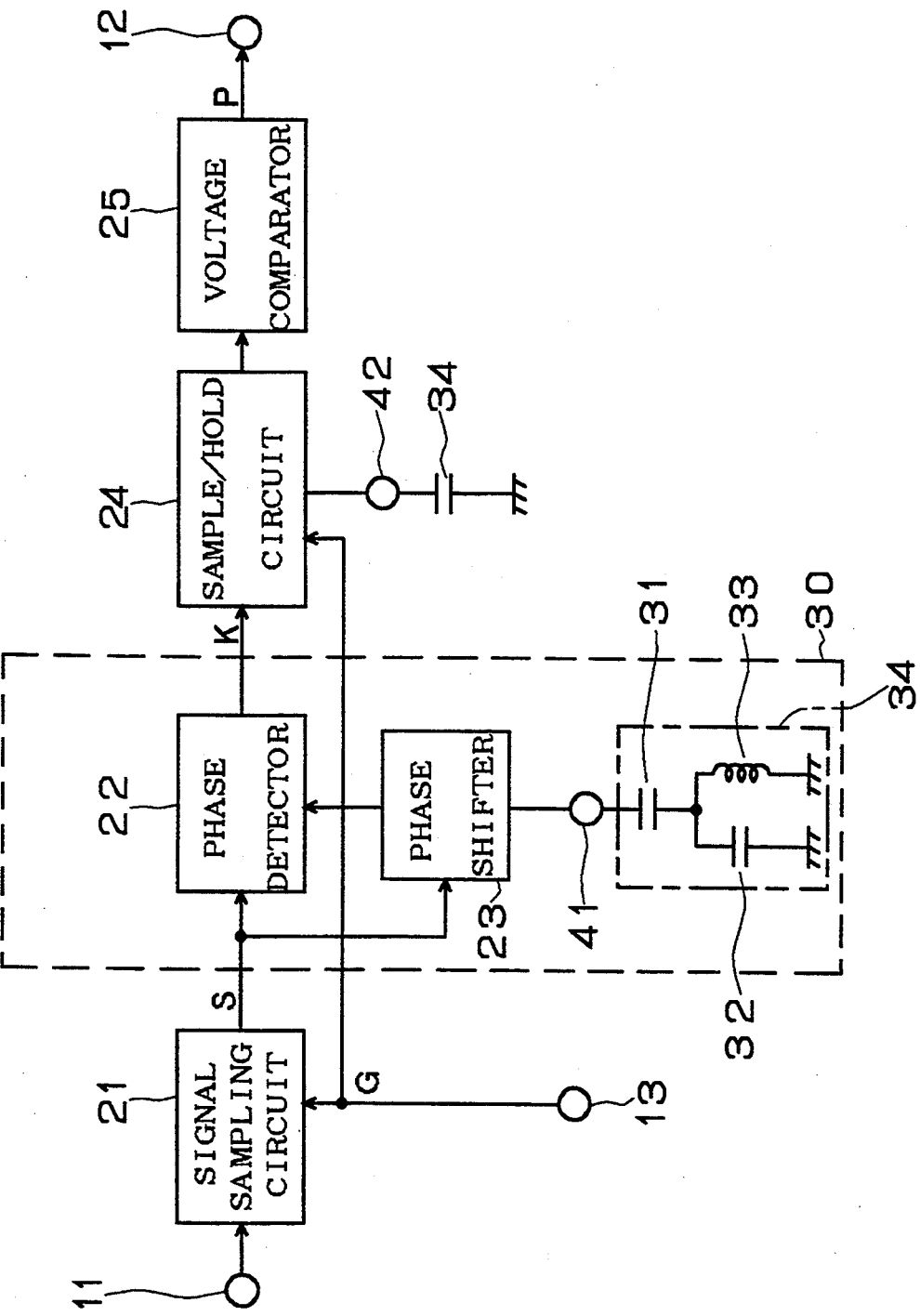
FIG. 9 is a block diagram illustrating a prior art technology.

FIG. 8 is a block diagram showing a structure of a frequency finding circuit 103 of still a third preferred embodiment according to the present invention, where the structure of the frequency discriminator 30 differs from those in the first and second preferred embodiments.

In this embodiment, the frequency discriminator 30 consists of a band limiter 28 and an amplitude detector 29 connected in series. The band limiter 28 permits the sampled input signal S to pass therein only when the input signal S is in a predetermined specific frequency band, and the amplitude detector 29 detects a passing signal. Thus, the frequency discriminator 30, as a whole, applies a magnitude of a signal having a specified frequency component or a signal K to the voltage comparator 25. After that, a procedure to the deciding signal P received from the voltage comparator 25 as in the second preferred embodiment may be performed by using the output circuit 50 consisting of the logic circuit 27 and the latch circuit 26, so that the frequency of the input signal can be found in a stable condition without the capacitor 34 and the external terminal 42.

Also, in this preferred embodiment, an exemplary structure of the logic circuit 27 may be either of those of the above-mentioned first and second structures. Moreover, as in the first embodiment, the output circuit 50 may be comprised of the latch circuit 26 alone although not shown.

While the invention has been shown and described in detail, the foregoing description is in all aspects illustrative and not restrictive. It is therefore understood that numerous modifications and variations can be devised without departing from the scope of the invention.

I claim:

1. A frequency finding circuit comprising:
    an input terminal;
    an output terminal;
    a signal sampling circuit for receiving a control signal and for sampling, for a specified period of time, an input signal received on said input terminal, in accordance with said control signal and for further outputting a sampling signal;
    a frequency deciding circuit for producing a deciding signal which represents whether a frequency of said sampling signal is in a specified frequency band; and
    an output circuit receiving said deciding signal for applying an output signal to said output terminal;
    said output circuit having a latch circuit which holds said deciding signal in accordance with said control signal.

2. A frequency finding circuit according to claim 1, wherein said latch circuit is a flip flop.

3. A frequency finding circuit according to claim 1, wherein said frequency deciding circuit includes a discriminator for discriminating an amplitude signal from said sampling signal.

4. A frequency finding circuit according to claim 3, wherein said discriminator includes
    a resonance circuit;
    a phase shifter for outputting a converted signal which is obtained by shifting a phase of said sampling signal based upon a difference between a resonance frequency of said resonance circuit and a frequency of said sampling circuit; and
    a phase detector for outputting a phase difference between said converted signal and said sampling signal.

5. A frequency finding circuit according to claim 4, wherein said frequency deciding circuit further includes a signal comparator for converting an output from said phase detector into a binary signal at a specified threshold level;
    said binary signal is equivalent to said deciding signal.

6. A frequency finding circuit according to claim 3, wherein said discriminator includes
    a band limiter for filtering said sampling signal; and
    an amplitude detecting circuit for detecting an output from said band limiter to output said amplitude signal.

7. A frequency finding circuit according to claim 6, wherein said frequency deciding circuit further includes a signal comparator for converting an output from said amplitude detecting circuit into a binary signal at a specified threshold level;
    said binary signal is equivalent to said deciding signal.

8. A frequency finding circuit according to claim 1, wherein said output circuit further has a logic circuit for conducting a specified procedure to said deciding signal in accordance with said control signal to obtain said output signal.

9. A frequency finding circuit according to claim 8, wherein
    said sampling signal is plural in nature and includes at least a first sampling signal and a second sampling signal, wherein said second sampling signal is preceded by said first sampling signal; and
    said logic circuit inverts a first of said output signal obtained based upon said first sampling signal when the number of said deciding signals derived from said second sampling signal is different in logic from said first of said output signal is equal to a specified upper limit level or over.

10. A frequency finding circuit according to claim 9, wherein said logic circuit includes
    a counter for counting the incessantness of discordances of a logic of said deciding signal with a logic of said output signal; and an incessantness comparator for comparing said incessantness of discordances with said upper limit level.

11. A frequency finding circuit according to claim 10, wherein said logic circuit further includes
- an input deciding unit for finding a discordance of a logic of said deciding signal with a logic of said output signal;
- a gate circuit for resetting said counter when an output from said input deciding unit exhibits a concordance of a logic of said deciding signal with a logic of said output signal and when said control signal is activated;
- fixed variable storing means for applying said upper limit level to said comparator; and
- an inverter for inverting said output signal when an output from said counter represents that the incessantness of said discordances is equal to said upper limit level or over.

12. A frequency finding circuit according to claim 11, wherein said input deciding unit includes a switch for switching a connecting condition in accordance with a logic status of said output signal having a common terminal connected to said counter, a first terminal on which said deciding signal is input, a second terminal to which a logic inverted from said deciding signal is applied.

13. A frequency finding circuit according to claim 9, wherein said logic circuit includes an n-level shift register operating in accordance with said control signal;
- a counter for counting the incessantness of discordances of a logic of each level of said shift register with a logic of said output signal; and
- an incessanthess comparator for comparing the incessanthess of said discordances with said upper limit level.

14. A frequency finding circuit according to claim 13, wherein said logic circuit further includes
- an input deciding unit for finding a discordance of a logic of said deciding signal with a logic of said output signal to apply it to said shift register;
- a clock generator controlling an operation of said counter for generating a clock having a frequency more than said n-times as high as a frequency of said control signal;
- a selector for applying a logic of each level of said shift register to said counter in accordance with said clock;
- fixed variable storing means for applying said upper limit level to said comparator; and
- an inverter for inverting said output signal when an output from said counter represents that the incessanthess of said discordances is equal to said upper limit level or over, and
- said shift register is reset when said inverter is operative.

15. A frequency finding circuit according to claim 14, wherein said input deciding unit includes a switch for switching a connecting condition in accordance with a logic status of said output signal having a common terminal connected to said counter, a first terminal on which said deciding signal is input, a second terminal to which a logic inverted from said deciding signal is applied.

* * * * *